(12) United States Patent
Bharj et al.

(10) Patent No.: US 9,444,422 B2
(45) Date of Patent: Sep. 13, 2016

(54) CONTEXTUAL VOLUME CONTROL

(71) Applicant: ECHOSTAR UK HOLDINGS LIMITED, Keighley, West Yorkshire (GB)

(72) Inventors: Manjit Bharj, Leeds (GB); Liz Hansell, Bingley (GB)

(73) Assignee: EchoStar UK Holdings Limited, Steeton (GB)

( * ) Notice: Subject to any disclaimer, the term of this patent is extended or adjusted under 35 U.S.C. 154(b) by 98 days.

(21) Appl. No.: 14/470,225

(22) Filed: Aug. 27, 2014

(65) Prior Publication Data

US 2016/0065155 A1    Mar. 3, 2016

(51) Int. Cl.
| | |
|---|---|
| *H03G 3/20* | (2006.01) |
| *H03G 1/02* | (2006.01) |
| *H03G 3/32* | (2006.01) |
| *H04N 5/44* | (2011.01) |
| *H04N 5/60* | (2006.01) |
| *H04N 21/41* | (2011.01) |
| *H04N 21/422* | (2011.01) |
| *H04N 21/439* | (2011.01) |

(52) U.S. Cl.
CPC .......... *H03G 1/02* (2013.01); *H03G 3/32* (2013.01); *H04N 5/4403* (2013.01); *H04N 5/60* (2013.01); *H04N 21/4126* (2013.01); *H04N 21/42222* (2013.01); *H04N 21/4396* (2013.01); *H04N 2005/4428* (2013.01)

(58) Field of Classification Search
None
See application file for complete search history.

(56) References Cited

U.S. PATENT DOCUMENTS

| | | | | |
|---|---|---|---|---|
| 5,450,494 A | * | 9/1995 | Okubo | H03G 3/32 348/E5.122 |
| 5,615,270 A | * | 3/1997 | Miller | H03G 3/32 381/108 |
| 5,666,426 A | * | 9/1997 | Helms | H03G 3/32 381/104 |
| 5,790,671 A | * | 8/1998 | Cooper | H03G 3/32 381/103 |
| 6,584,201 B1 | * | 6/2003 | Konstantinou | H03G 3/32 348/734 |
| 6,868,162 B1 | * | 3/2005 | Jubien | H03G 5/22 381/107 |
| 8,041,025 B2 | * | 10/2011 | Dolph | H04N 5/60 379/388.03 |
| 2004/0029637 A1 | | 2/2004 | Hein et al. | |
| 2005/0282590 A1 | * | 12/2005 | Haparnas | H04M 19/044 455/570 |
| 2010/0146445 A1 | | 6/2010 | Kraut | |
| 2010/0158275 A1 | * | 6/2010 | Zhang | H03G 3/32 381/107 |
| 2011/0293113 A1 | * | 12/2011 | McCarthy | H03G 3/32 381/107 |
| 2012/0020486 A1 | | 1/2012 | Fried et al. | |
| 2012/0087516 A1 | | 4/2012 | Amin | |
| 2013/0136266 A1 | * | 5/2013 | McClain | H03G 3/32 381/57 |

FOREIGN PATENT DOCUMENTS

EP    2 391 004 A1    11/2011

OTHER PUBLICATIONS

International Search Report and Written Opinion for PCT/GB2015/052462 mailed Nov. 4, 2015, 13 pages.

* cited by examiner

*Primary Examiner* — Tan X Dinh
(74) *Attorney, Agent, or Firm* — Kilpatrick Townsend & Stockton LLP

(57) ABSTRACT

Adjustment of volume level of a mobile device, by the mobile device without direct or manual user-input, based on one or more contextual parameters detected by the mobile device, such as ambient noise level.

18 Claims, 7 Drawing Sheets

CONTEXTUAL VOLUME CONTROL

BACKGROUND

The advent of the digital video recorder and multi-tuner television receiver have made available many possibilities to television service providers and viewers alike. In addition, viewers have come to expect flexibility and convenience with respect to facilitating communication and interoperability amongst their television receivers and other ones of the varied electronic devices that they may own.

SUMMARY

In an aspect, a method may include or comprise detecting, by a mobile device, ambient noise level at time of output of audio by the mobile device at a particular volume level. The method may further include or comprise comparing, by the mobile device, the ambient noise level to a threshold value. The method further include or comprise decreasing, by the mobile device, the particular volume level by a predetermined factor when the ambient noise level is greater than or equal to the threshold value.

In an aspect, a method may include or comprise outputting, by a mobile device, audio at a particular volume level. The method may further include or comprise monitoring, by the mobile device level at time of outputting the audio, for occurrence of a particular state or parameter detectable by the mobile device. The method may further include or comprise decreasing, by the mobile device, the particular volume level in response to detecting occurrence of the particular state or parameter by the mobile device so that output volume level of the mobile device is less than the particular volume level.

In an aspect, a television receiver may include or comprise at least one processor, at least one communications interface communicatively coupled with the at least one processor, and at least one memory element communicatively coupled with and readable by at least one processor and having stored therein processor-readable instructions. The processor-readable instructions when executed by the at least one processor may cause the at least one processor to send to a mobile device via the at least one communications interface data that corresponds to a definition of a threshold value used by the mobile device to compare with ambient noise level detected by the mobile device and to enable the mobile device to decrease output volume level of the mobile device when ambient noise level detected by the mobile device is greater than or equal to the threshold value.

Other aspects are possible.

DETAILED DESCRIPTION

The present disclosure is directed to or towards systems and methods for adjusting the volume of a particular mobile device, by the mobile device without direct manual user-input, or "automatically," based on one or more "contextual" parameters. An example of such a parameter may include ambient noise level. In this example, it is contemplated that the mobile device may detect magnitude of ambient noise level, which in many cases may be an indication of a situation or surrounding a user of the mobile device may instantly find themselves in, such as a busy motor vehicle intersection, train station, etc., and at the same time detect the volume level of audio currently being output by the computing device. Here, it will be appreciated that if the volume of audio currently being output by the mobile device is of magnitude similar to, or greater than, etc., the magnitude of ambient noise, then the user of the mobile device may not necessarily be fully aware of the current situation or surrounding. In other words, the user of the mobile device may find themselves distracted by the audio currently being output by the mobile device, by virtue of how loud that audio is. This could potentially lead to a situation in which the user of the mobile device might put themselves, or others, in danger or jeopardy. For example, the user of the mobile device might not notice that someone is following them, that they are about to enter the above-mentioned busy intersection, and so on.

Figure 1:
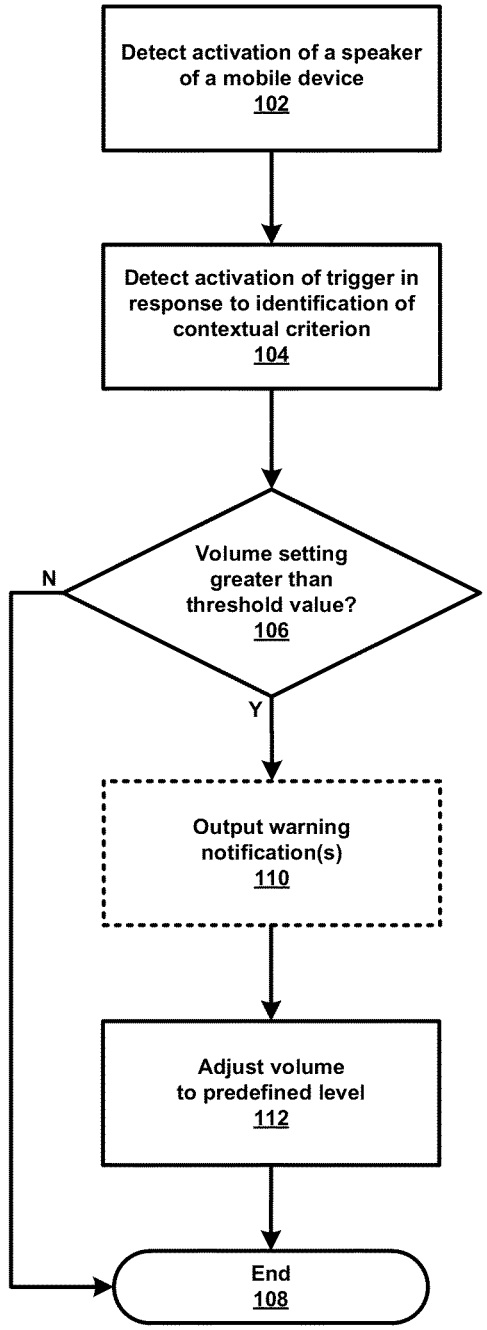
FIG. 1 shows a first example method according to the disclosure.

The various features or aspects of the present disclosure address this and other issues associated with the potential of being too distracted by audio currently being output by a particular computing device, such as a smartphone for example, by automatically adjusting the volume of that computing device when one or more contextual criterion are determined to be met by the computing device itself. In addition, it is contemplated that various features or aspects of the present disclosure may be incorporated into or within a television receiver as part of a satellite television implementation, as discussed in further detail below. This may, among other things, serve to entice new customers to subscribe to services as offered by a particular satellite television provider, as well as provide an incentive for existing customers to maintain their loyalty and/or relationship with the particular satellite television provider. Although not so limited, an appreciation of the various aspects of the present disclosure may be gained from the following discussion in connection with the drawings. For instance, referring now to FIG. 1, a first example method 100 is shown in accordance with the present disclosure.

At step 102, a mobile device such as a smartphone or tablet computer may, for example, initially detect activation of a speaker(s) of the mobile device, as well as a volume level of audio currently being output by the mobile device via the speaker. For example, a user of the mobile device may interact with the same to activate a media player to output digital audio (and/or video) by a speaker of the mobile device, and also to adjust a volume level of the audio as output by the mobile device. It is contemplated though that the output of the audio may not necessarily be via a particular speaker of the mobile device. For example, headphones may be plugged into the mobile device, and thus output of the audio may be via headphone jack of the mobile device. In either scenario, the mobile device may be considered a source of the audio and further used to control volume of the audio, and the mobile device itself may be considered to be configured and/or arranged such that a magnitude of volume of the audio, or volume level, as output by the mobile device may be quantified by the same.

At step 104, the mobile device may detect a trigger generated by the same in response to identification of one or more contextual criterion determined to be met by the mobile device. As mentioned above, an example contextual parameter consistent with the principles of the present disclosure, that which may be monitored or sensed by the mobile device as part of a determination or identification of the one or more contextual criterion, may include ambient noise level. Here, it is contemplated that the mobile device itself may monitor continuously, periodically, or at least intermittently, via a microphone incorporated therein, for example, ambient noise level, and then or when ambient noise level reaches a predetermined and user-configurable threshold value, the mobile device may at the same time determine a current magnitude of volume of the audio as output by the mobile device. Here, when the current volume level of the audio as output by the mobile device is greater than or equal to a predetermined and user-configurable threshold value, one or more steps or actions may be taken by the mobile device so as to minimize the possibility that the user of the mobile device may be too distracted to adequately respond to a potentially hazardous situation.

Specifically, at step 106, a determination may be made by the mobile device as to whether the current magnitude of volume of the audio as output by the mobile device is greater than or equal to a predetermined and user-configurable threshold value. When, for example, the current magnitude of volume of the audio as output by the mobile device is not greater than or equal to the predetermined and user-configurable threshold value, process flow within the example method 100 may branch to termination step 108. When, however, the current magnitude of volume of the audio as output by the mobile device is greater than or equal to the predetermined and user-configurable threshold value, process flow within the example method 100 may, optionally, as indicated by intermittent line in FIG. 1, branch to step 110.

At step 110, the mobile device may itself output one or more warning notifications or the like. For example, the mobile device may be configured and/or arranged to "vibrate" as a cue to indicate to the user of the mobile device to pay attention or become more aware of a current situation or surrounding. Here, it is contemplated that a pattern of the vibration may be predetermined and user-configurable, so that the user of the mobile device may quickly discern that the vibration is in fact a warning notification. For example, the user of the mobile device may configure the pattern of the vibration as "long-stop-long-stop-long" so as to be distinguished from a vibration associated with notification of receipt of a text message which may, for example, have a pattern of vibration as "short-stop-short-stop" or the like. As another example, the mobile device may be configured and/or arranged to output an audio "beep" and/or a perceptible verbal warning such as, "Warning, you need to pay attention," as a cue to indicate to the user of the mobile device to pay attention or become more aware of the current situation or surrounding. In this manner, the mobile device may be configured and/or arranged to output one or both of a tactile message and an audio message as a cue to indicate to the user of the mobile device to pay attention or become more aware of the current situation or surrounding. Other examples are possible as well. For the mobile device may be configured and/or arranged to output a visual message "DANGER" in "red" font color via a touchscreen, and/or to output a "flashing" light sequence via LED (Light Emitting Diode), and so on.

Next, at step 112, the mobile device itself may attenuate the current magnitude of volume of the audio as output by the mobile device, to a predetermined and user-configurable value. Here, it is contemplated that that value may be expressed in any number of ways. For example, the mobile device itself may attenuate the current magnitude of volume of the audio as output by the mobile device by "50%" for instance, so as to minimize the possibility that the user of the mobile device may be too distracted to adequately respond to a potentially hazardous situation. As another example, the mobile device itself may adjust a volume setting level to "Level 2 of 10" to reduce or attenuate magnitude of the audio as output by the mobile device, so as to minimize the possibility that the user of the mobile device may be too distracted to adequately respond to a potentially hazardous situation. As still another example, the mobile device may "fully mute" itself so that the audio is no longer even output by the mobile device, so as to minimize the possibility that the user of the mobile device may be too distracted to adequately respond to a potentially hazardous situation. Further scenarios and beneficial aspects associated with adjusting the volume of a particular mobile device, by the mobile device without direct manual user-input based on one or more contextual parameters are described in detail below in connection with FIGS. 2-7.

Figure 2:
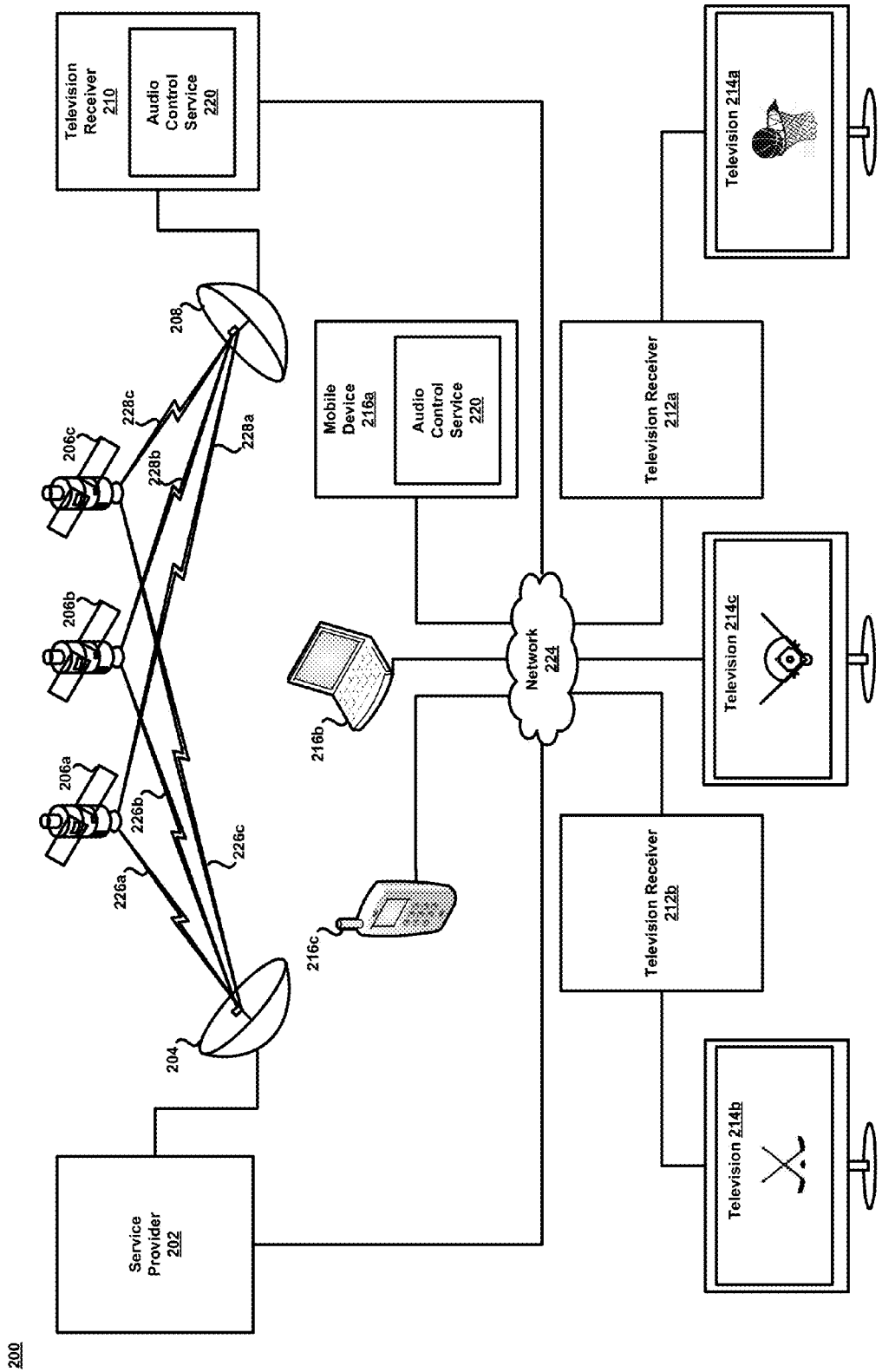
FIG. 2 shows an example content distribution system according to the disclosure.

Referring now to FIG. 2, an example satellite television distribution system 200 is shown in accordance with the present disclosure. For brevity, the system 200 is depicted in a simplified form, and may include more or fewer systems, devices, networks, and/or other components as desired. Further, number and type of features or elements incorporated within the system 200 may or may not be implementation-specific, and at least some of the aspects of the system 200 may be similar to a cable television distribution system, an IPTV (Internet Protocol Television) content distribution system, and/or any other type of media content distribution system as desired.

The example system 200 may include a service provider 202, a satellite uplink 204, a plurality of satellites 206*a-c*, a satellite dish 208, a PTR (Primary Television Receiver) 210, a plurality of STRs (Secondary Television Receivers) 212*a-b*, a plurality of televisions 214*a-c*, a plurality of computing devices 216*a-c*. Additionally, the PTR 210 and computing devices 216*a-c* may include an ACS (Audio Control Service) module 220. In general, the ACS module 220 may be configured and arranged to implement various features associated with adjusting the volume of a particular computing device, by the computing device without direct manual user-input, based on one or more contextual parameters in accordance with the principles of the present disclosure. As discussed in further detail below, examples of such parameters include time of day, ambient noise level, physical movement or displacement, absolute location or position, and etc.

The system 200 may further include at least one network 224 that establishes a bi-directional communication path for data transfer between and among each respective element of the system 200, outside or separate from the unidirectional satellite signaling path. The network 224 is intended to represent any number of terrestrial and/or non-terrestrial network features or elements. For example, the network 224 may incorporate or exhibit any number of features or elements of various wireless and/or hardwired packet-based communication networks such as, for example, a WAN (Wide Area Network) network, a HAN (Home Area Network) network, a LAN (Local Area Network) network, a WLAN (Wireless Local Area Network) network, the Internet, a cellular communications network, or any other type of communication network configured such that data may be transferred between and among respective elements of the system 200.

The PTR 210, and the STRs 212*a-b*, as described throughout may generally be any type of television receiver, television converter, etc., such as a STB for example. In another example, the PTR 210, and the STRs 212*a-b*, may exhibit functionality integrated as part of or into a television, a DVR (Digital Video Recorder), a computer such as a tablet computing device, or any other computing system or device, as well as variations thereof. Further, the PTR 210 and the network 224, together with the STRs 212*a-b* and televisions 214*a-c*, and possibly the computing devices 216*a-c*, may each be incorporated within or form at least a portion of a particular home computing network. Further, the PTR 210 may be configured so as to enable communications in accordance with any particular communication protocol(s) and/or standard(s) including, for example, TCP/IP (Transmission Control Protocol/Internet Protocol), DLNA/DTCP-IP (Digital Living Network Alliance/Digital Transmission Copy Protection over Internet Protocol), HDMI/HDCP (High-Definition Multimedia Interface/High-bandwidth Digital Content Protection), etc. Other examples are possible. For example, one or more of the various elements or components of the example system 200 may be configured to communicate in accordance with the MoCA® (Multimedia over Coax Alliance) home entertainment networking standard. Still other examples are possible.

In practice, the satellites 206*a-c* may each be configured to receive uplink signals 226*a-c* from the satellite uplink 204. In this example, each the uplink signals 226*a-c* may contain one or more transponder streams of particular data or content, such as one or more particular television channels, as supplied by the service provider 202. For example, each of the respective uplink signals 226*a-c* may contain various media content such as encoded HD (High Definition) television channels, SD (Standard Definition) television channels, on-demand programming, programming information, and/or any other content in the form of at least one transponder stream, and in accordance with an allotted carrier frequency and bandwidth. In this example, different media content may be carried using different ones of the satellites 206*a-c*.

Further, different media content may be carried using different transponders of a particular satellite (e.g., satellite 206*a*); thus, such media content may be transmitted at different frequencies and/or different frequency ranges. For example, a first and second television channel may be carried on a first carrier frequency over a first transponder of satellite 206*a*, and a third, fourth, and fifth television channel may be carried on second carrier frequency over a first transponder of satellite 206*b*, or, the third, fourth, and fifth television channel may be carried on a second carrier frequency over a second transponder of satellite 206*a*, and etc. Each of these television channels may be scrambled such that unauthorized persons are prevented from accessing the television channels.

The satellites 206*a-c* may further be configured to relay the uplink signals 226*a-c* to the satellite dish 208 as downlink signals 228*a-c*. Similar to the uplink signals 226*a-c*, each of the downlink signals 228*a-c* may contain one or more transponder streams of particular data or content, such as various encoded and/or at least partially electronically scrambled television channels, on-demand programming, etc., in accordance with an allotted carrier frequency and bandwidth. The downlink signals 228*a-c*, however, may not necessarily contain the same or similar content as a corresponding one of the uplink signals 226*a-c*. For example, the uplink signal 226*a* may include a first transponder stream containing at least a first group or grouping of television channels, and the downlink signal 228*a* may include a second transponder stream containing at least a second, different group or grouping of television channels. In other examples, the first and second group of television channels may have one or more television channels in common. In sum, there may be varying degrees of correlation between the uplink signals 226*a-c* and the downlink signals 228*a-c*, both in terms of content and underlying characteristics.

Further, satellite television signals may be different from broadcast television or other types of signals. Satellite signals may include multiplexed, packetized, and modulated digital signals. Once multiplexed, packetized and modulated, one analog satellite transmission may carry digital data representing several television stations or service providers. Some examples of service providers include HBO®, CBS®, ESPN®, and etc. Further, the term "channel," may in some contexts carry a different meaning from or than its normal plain language meaning. For example, the term "channel" may denote a particular carrier frequency or sub-band which can be tuned to by a particular tuner of a television receiver. In other contexts though, the term "channel" may refer to a single program/content service such as HBO®.

Additionally, a single satellite may typically have multiple transponders (e.g., 32 transponders) each one broadcasting a channel or frequency band of about 24-27 MHz in a broader frequency or polarity band of about 500 MHz. Thus, a frequency band of about 500 MHz may contain numerous sub-bands or channels of about 24-27 MHz, and each channel in turn may carry a combined stream of digital data comprising a number of content services. For example, a particular hypothetical transponder may carry HBO®, CBS®, ESPN®, plus several other channels, while another particular hypothetical transponder may itself carry 3, 4, 5, 6, etc., different channels depending on the bandwidth of the particular transponder and the amount of that bandwidth occupied by any particular channel or service on that transponder stream. Further, in many instances a single satellite may broadcast two orthogonal polarity bands of about 500 MHz. For example, a first polarity band of about 500 MHz broadcast by a particular satellite may be left-hand circular polarized, and a second polarity band of about 500 MHz may be right-hand circular polarized. Other examples are possible.

Continuing with the example scenario, the satellite dish 208 may be provided for use to receive television channels (e.g., on a subscription basis) provided by the service provider 202, satellite uplink 204, and/or satellites 206*a-c*. For example, the satellite dish 208 may be configured to receive particular transponder streams, or downlink signals 228*a-c*, from one or more of the satellites 206*a-c*. Based on the characteristics of the PTR 210 and/or satellite dish 208, however, it may only be possible to capture transponder streams from a limited number of transponders concurrently. For example, a particular tuner of the PTR 210 may be configured to tune to a single transponder stream from a transponder of a single satellite at a time.

Additionally, the PTR 210, which is communicatively coupled to the satellite dish 208, may subsequently select via tuner, decode, and relay particular transponder streams to the television 214*c* for display thereon. For example, the satellite dish 208 and the PTR 210 may, respectively, be configured to receive, decode, and relay at least one premium HD-formatted television channel to the television 214c. Programming or content associated with the HD channel may generally be presented live, or from a recording as previously stored on, by, or at the PTR 210. Here, the HD channel may be output to the television 214c in accordance with the HDMI/HDCP content protection technologies. Other examples are however possible.

Further, the PTR 210 may select via tuner, decode, and relay particular transponder streams to one or both of the STRs 212a-b, which may in turn relay particular transponder streams to a corresponding one of the televisions 214a-b for display thereon. For example, the satellite dish 208 and the PTR 210 may, respectively, be configured to receive, decode, and relay at least one television channel to the television 214a by way of the STR 212a. Similar to the above-example, the television channel may generally be presented live, or from a recording as previously stored on the PTR 210, and may be output to the television 214a by way of the STR 212a in accordance with a particular content protection technology and/or networking standard. Still further, the satellite dish 208 and the PTR 210 may, respectively, be configured to receive, decode, and relay at least one premium television channel to one or each of the computing devices 216a-c. Similar to the above-examples, the television channel may generally be presented live, or from a recording as previously stored on the PTR 210, and may be output to one or both of the computing devices 216a-c in accordance with a particular content protection technology and/or networking standard.

Figure 3:
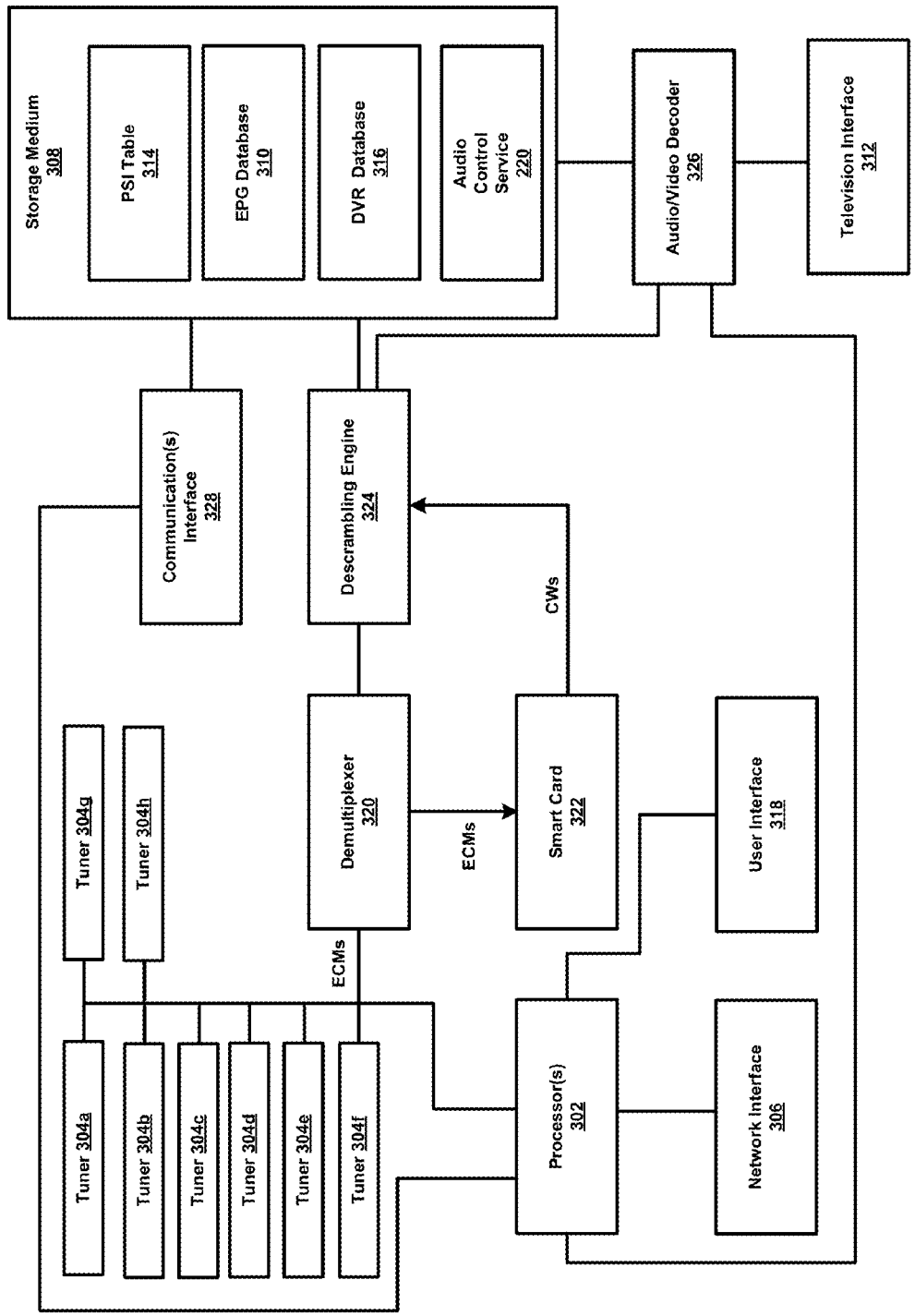
FIG. 3 shows an example block diagram of a television receiver.

Referring now to FIG. 3, an example block diagram of the PTR 210 of FIG. 2 is shown in accordance with the disclosure. In some examples, STRs 312a-b may be configured in a manner similar to that of the PTR 210. In some examples, the STRs 312a-b may be configured and arranged to exhibit a reduced functionality as compared to the PTR 210, and may depend at least to a certain degree on the PTR 210 to implement certain features or functionality. The STRs 312a-b in this example may be each referred to as a "thin client."

The PTR 210 may include one or more processors 302, a plurality of tuners 304a-h, at least one network interface 306, at least one non-transitory computer-readable storage medium 308, at least one EPG (Electronic Programming Guide) database 310, at least one television interface 312, at least one PSI (Program Specific Information) table 314, at least one DVR database 316, at least one user interface 318, at least one demultiplexer 320, at least one smart card 322, at least one descrambling engine 324, at least one decoder 326, and at least one communication interface 328. In other examples, fewer or greater numbers of components may be present. Further, functionality of one or more components may be combined; for example, functions of the descrambling engine 324 may be performed by the processors 302. Still further, functionality of components may be distributed among additional components, and possibly additional systems such as, for example, in a cloud-computing implementation.

The processors 302 may include one or more specialized and/or general-purpose processors configured to perform processes such as tuning to a particular channel, accessing and displaying EPG information, and/or receiving and processing input from a user. For example, the processors 302 may include one or more processors dedicated to decoding video signals from a particular format, such as according to a particular MPEG (Motion Picture Experts Group) standard, for output and display on a television, and for performing or at least facilitating decryption or descrambling.

The tuners 304a-h may be used to tune to television channels, such as television channels transmitted via satellites 306a-c. Each one of the tuners 304a-h may be capable of receiving and processing a single stream of data from a satellite transponder, or a cable RF channel, at a given time. As such, a single tuner may tune to a single transponder or, for a cable network, a single cable channel. Additionally, one tuner (e.g., tuner 304a) may be used to tune to a television channel on a first transponder stream for display using a television, while another tuner (e.g., tuner 304b) may be used to tune to a television channel on a second transponder for recording and viewing at some other time. If multiple television channels transmitted on the same transponder stream are desired, a particular tuner (e.g., tuner 304c) may be used to receive the signal containing the multiple television channels for presentation and/or recording of each of the respective multiple television channels, such as in a PTAT (Primetime Anytime) implementation for example. Although eight tuners are shown, the PTR 210 may include more or fewer tuners (e.g., three tuners, sixteen tuners, etc.), and the features of the disclosure may be implemented similarly and scale according to the number of tuners of the PTR 210.

The network interface 306 may be used to communicate via alternate communication channel(s) with a service provider. For example, the primary communication channel between the service provider 202 of FIG. 2 and the PTR 210 may be via satellites 306a-c, which may be unidirectional to the PTR 210, and an another communication channel between the service provider 202 and the PTR 210, which may be bidirectional, may be via the network 224. In general, various types of information may be transmitted and/or received via the network interface 306.

The storage medium 308 may represent a non-transitory computer-readable storage medium. The storage medium 308 may include memory and/or a hard drive. The storage medium 308 may be used to store information received from one or more satellites and/or information received via the network interface 306. For example, the storage medium 308 may store information related to the EPG database 310, the PSI table 314, and/or the DVR database 316, among other elements or features, such as the ACS module 220 mentioned above. Recorded television programs may be stored using the storage medium 308.

The EPG database 310 may store information related to television channels and the timing of programs appearing on such television channels. Information from the EPG database 310 may be used to inform users of what television channels or programs are available, popular and/or provide recommendations. Information from the EPG database 310 may be used to generate a visual interface displayed by a television that allows a user to browse and select television channels and/or television programs for viewing and/or recording. Information used to populate the EPG database 310 may be received via the network interface 306 and/or via satellites 206a-c of FIG. 2. For example, updates to the EPG database 310 may be received periodically via satellite. The EPG database 310 may serve as an interface for a user to control DVR functions of the PTR 210, and/or to enable viewing and/or recording of multiple television channels simultaneously.

The decoder 326 may convert encoded video and audio into a format suitable for output to a display device. For instance, the decoder 326 may receive MPEG video and audio from the storage medium 308, or the descrambling engine 324, to be output to a television. MPEG video and audio from the storage medium 308 may have been recorded to the DVR database 316 as part of a previously-recorded television program. The decoder 326 may convert the MPEG video and audio into a format appropriate to be displayed by a television or other form of display device and audio into a format appropriate to be output from speakers, respectively. The decoder 326 may be a single hardware element capable of decoding a finite number of television channels at a given time, such as in a time-division arrangement. In the example embodiment, eight television channels may be decoded concurrently or simultaneously.

The television interface 312 output a signal to a television, or another form of display device, in a proper format for display of video and play back of audio. As such, the television interface 312 may output one or more television channels, stored television programming from the storage medium 308, such as television programs from the DVR database 316 and/or information from the EPG database 310 for example, to a television for presentation.

The PSI table 314 may store information used by the PTR 210 to access various television channels. Information used to populate the PSI table 314 may be received via satellite, or cable, through the tuners 304a-h and/or may be received via the network interface 306 over the network 224 from the service provider 202 shown in FIG. 2. Information present in the PSI table 314 may be periodically or at least intermittently updated. Information that may be present in the PSI table 314 may include: television channel numbers, satellite identifiers, frequency identifiers, transponder identifiers, ECM PIDs (Entitlement Control Message, Packet Identifier), one or more audio PIDs, and video PIDs. A second audio PID of a channel may correspond to a second audio program, such as in another language. In some examples, the PSI table 314 may be divided into a number of tables, such as a NIT (Network Information Table), a PAT (Program Association Table), and a PMT (Program Management Table).

Table 1 below provides a simplified example of the PSI table 314 for several television channels. It should be understood that in other examples, many more television channels may be represented in the PSI table 314. The PSI table 314 may be periodically or at least intermittently. As such, television channels may be reassigned to different satellites and/or transponders, and the PTR 210 may be able to handle this reassignment as long as the PSI table 314 is updated.

TABLE 1

| Channel | Satellite | Transponder | ECM PID | Audio PIDs | Video PID |
|---------|-----------|-------------|---------|------------|-----------|
| 4       | 1         | 2           | 27      | 2001       | 1011      |
| 5       | 2         | 11          | 29      | 2002       | 1012      |
| 7       | 2         | 3           | 31      | 2003       | 1013      |
| 13      | 2         | 4           | 33      | 2003, 2004 | 1013      |

It should be understood that the values provided in Table 1 are for example purposes only. Actual values, including how satellites and transponders are identified, may vary. Additional information may also be stored in the PSI table 314. Video and/or audio for different television channels on different transponders may have the same PIDs. Such television channels may be differentiated based on which satellite and/or transponder to which a tuner is tuned.

DVR functionality of the PTR 210 may permit a television channel to be recorded for a period of time. The DVR database 316 may store timers that are used by the processors 302 to determine when a television channel should be tuned to and recorded to the DVR database 245 of storage medium 308. In some examples, a limited amount of space of the storage medium 308 may be devoted to the DVR database 316. Timers may be set by the service provider 202 and/or one or more users of the PTR 210. DVR functionality of the PTR 210 may be configured by a user to record particular television programs. The PSI table 314 may be used by the PTR 210 to determine the satellite, transponder, ECM PID, audio PID, and video PID. The user interface 318 may include a remote control, physically separate from PTR 210, and/or one or more buttons on the PTR 210 that allows a user to interact with the PTR 210. The user interface 318 may be used to select a television channel for viewing, view information from the EPG database 310, and/or program a timer stored to the DVR database 316 wherein the timer may be used to control the DVR functionality of the PTR 210.

Referring back to the tuners 304a-h, television channels received via satellite may contain at least some encrypted or scrambles data. Packets of audio and video may be scrambled to prevent unauthorized users, such as nonsubscribers, from receiving television programming without paying the service provider 202. When one of the tuners 304a-h is receiving data from a particular transponder of a satellite, the transponder stream may be a series of data packets corresponding to multiple television channels. Each data packet may contain a PID, which in combination with the PSI table 314, can be determined to be associated with a particular television channel. Particular data packets, referred to as ECMs may be periodically transmitted. ECMs may be encrypted; the PTR 210 may use the smart card 322 to decrypt ECMs.

The smart card 322 may function as the CA (Controlled Access) which performs decryption of encryption data to obtain control words that are used to descramble video and/or audio of television channels. Decryption of an ECM may only be possible when the user (e.g., an individual who is associated with the PTR 210) has authorization to access the particular television channel associated with the ECM. When an ECM is received by the demultiplexer 320 and the ECM is determined to correspond to a television channel being stored and/or displayed, the ECM may be provided to the smart card 322 for decryption.

When the smart card 322 receives an encrypted ECM from the demultiplexer 320, the smart card 322 may decrypt the ECM to obtain some number of control words. In some examples, from each ECM received by the smart card 322, two control words are obtained. In some examples, when the smart card 322 receives an ECM, it compares the ECM to the previously received ECM. If the two ECMs match, the second ECM is not decrypted because the same control words would be obtained. In other examples, each ECM received by the smart card 322 is decrypted; however, if a second ECM matches a first ECM, the outputted control words will match; thus, effectively, the second ECM does not affect the control words output by the smart card 322. When an ECM is received by the smart card 322, it may take a period of time for the ECM to be decrypted to obtain the control words. As such, a period of time, such as about 0.2-0.5 seconds, may elapse before the control words indicated by the ECM can be obtained. The smart card 322 may be permanently part of the PTR 210 or may be configured to be inserted and removed from the PTR 210.

The demultiplexer 320 may be configured to filter data packets based on PIDs. For example, if a transponder data stream includes multiple television channels, data packets corresponding to a television channel that are not desired to be stored or displayed by the user may be ignored by the demultiplexer 320. As such, only data packets corresponding to the one or more television channels desired to be stored and/or displayed may be passed to either the descrambling engine 324 or the smart card 322; other data packets may be ignored. For each channel, a stream of video packets, a stream of audio packets and/or a stream of ECM packets may be present, each stream identified by a PID. In some examples, a common ECM stream may be used for multiple television channels. Additional data packets corresponding to other information, such as updates to the PSI table 314, may be appropriately routed by the demultiplexer 320.

The descrambling engine 324 may use the control words output by the smart card 322 in order to descramble video and/or audio corresponding to television channels for storage and/or presentation. Video and/or audio data contained in the transponder data stream received by the tuners 304a-h may be scrambled. The video and/or audio may be descrambled by the descrambling engine 324 using a particular control word. Which control word output by the smart card 322 to be used for successful descrambling may be indicated by a scramble control identifier present within the data packet containing the scrambled video or audio. Descrambled video and/or audio may be output by the descrambling engine 324 to the storage medium 308 for storage, such as part of the DVR database 316 for example, and/or to the decoder 326 for output to a television or other presentation equipment via the television interface 312.

The communication interface 328 may be used by the PTR 210 to establish a communication link or connection between the PTR 210 and one or more of the computing devices 216a-c as shown in FIG. 2. It is contemplated that the communication interface 328 may take or exhibit any form as desired, and may be configured in a manner so as to be compatible with a like component or element incorporated within or to the computing devices 216a-c, and further may be defined such that the communication link may be wired and/or or wireless. Example technologies consistent with the principles or aspects of the present disclosure may include, but are not limited to, Bluetooth®, WiFi, NFC (Near Field Communication), and/or any other communication device or subsystem similar to that discussed below in connection with FIG. 7.

For brevity, the PTR 210 is depicted in a simplified form, and may generally include more or fewer elements or components as desired, including those configured and/or arranged for implementing various features for adjusting the volume of a particular computing device, by the computing device without direct manual user-input, based on one or more "contextual" parameters as desirable, as discussed in the context of the present disclosure. For example, the PTR 210 is shown in FIG. 3 to include the ACS module 220 as mentioned above in connection with FIG. 2. While shown stored to the storage medium 308 as executable instructions, the ACS module 220 could, wholly or at least partially, be stored to the processor(s) 302 of the PTR 210. Further, some routing between the various modules of PTR 210 has been illustrated. Such illustrations are for exemplary purposes only. The state of two modules not being directly or indirectly connected does not indicate the modules cannot communicate. Rather, connections between modules of the PTR 210 are intended only to indicate possible common data routing. It should be understood that the modules of the PTR 210 may be combined into a fewer number of modules or divided into a greater number of modules.

Additionally, although not explicitly shown in FIG. 3, the PTR 210 may include one or more logical modules configured to implement a television steaming media functionality that encodes video into a particular format for transmission over the Internet such as to allow users to remotely view and control a home cable, satellite, or personal video recorder system from an Internet-enabled computer with a broadband Internet connection. The Slingbox® by Sling Media, Inc. of Foster City, Calif., is one example of a product that implements such functionality. Further, the PTR 210 may be configured to include any number of other various components or logical modules that are implemented in hardware, software, firmware, or any combination thereof, and such components or logical modules may or may not be implementation-specific.

Figure 4:
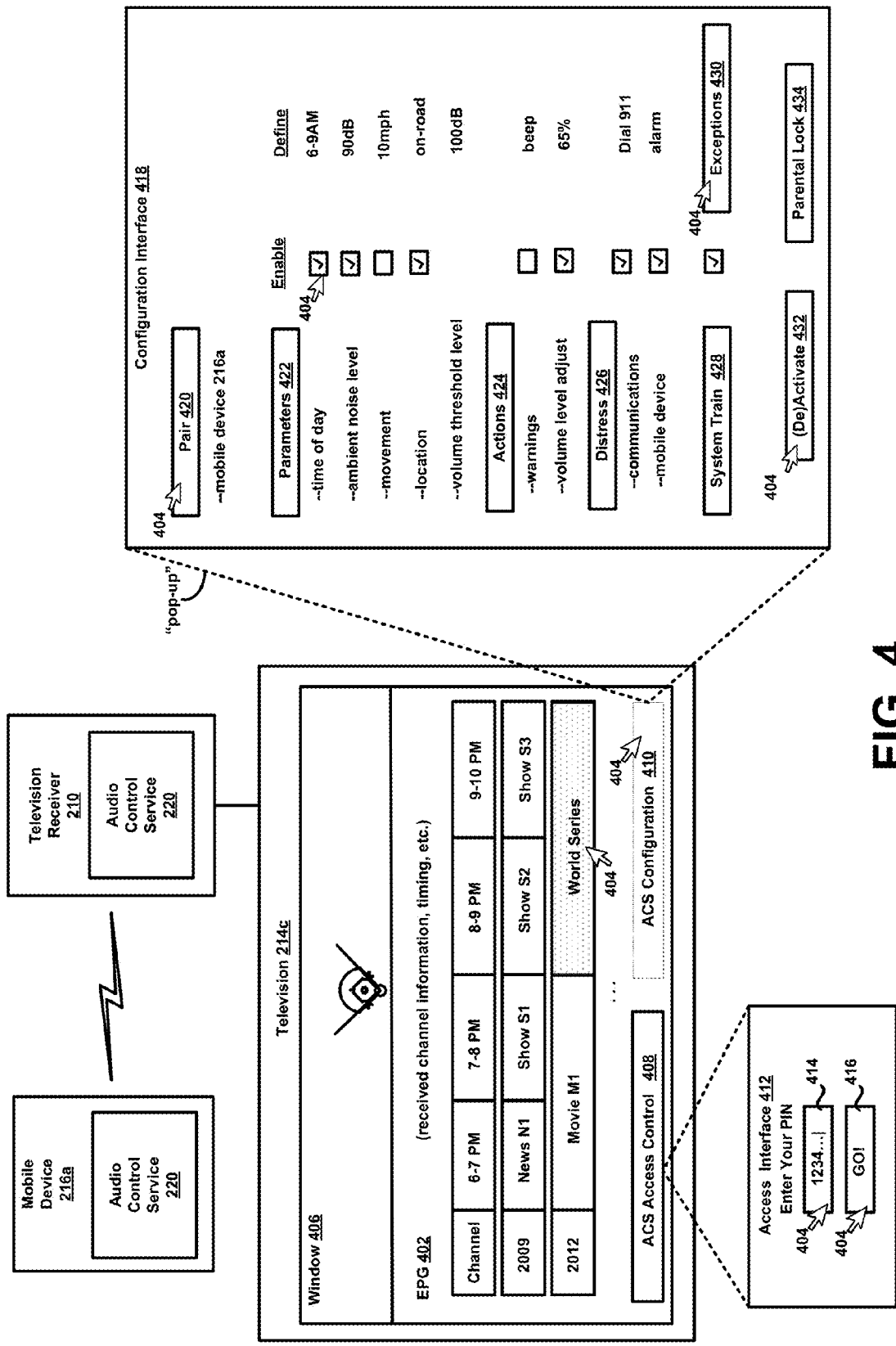
FIG. 4 shows first example aspects of the system of FIG. 2 in detail.

Referring now to FIG. 4, first aspects of the example system 200 of FIG. 2 are shown in detail. In particular, the PTR 210 may be configured to output an EPG (Electronic Programming Guide) 402 to and for presentation the television 214c, for example. The EPG 402 may at least present various information related to television channels and the timing of programs or programming appearing on such television channels. For example, as shown in FIG. 4, the EPG 402 may display information associated with a channel 2012, where the "World Series" is listed as scheduled to appear on that channel starting at a particular time on a particular day, and etc. In this example, and assuming that a current time is sometime during the time period 8-10 PM, a viewer may manipulate a cursor 404 using a pointing device (not shown) to select, as shown by stipple shading in FIG. 4, the World Series for immediate viewing within a window 406 on the television 214c. Other examples are possible. For example, it is contemplated that any menu-driven navigation technique or implementation may be used to enable user-interaction with the EPG 402, along with other elements or interfaces output by the PTR 210 to the television 214c.

In addition to the EPG 402, the PTR 210 may be configured to output various other interactive elements or interfaces. For example, the ACS module 220 may be configured to output a control selection 408 and a configuration selection 410. In general, the control selection 408 may be considered an access control mechanism to prevent those who may not necessarily be authorized from accessing functionality associated with the configuration selection 410. An example in which this may be beneficial is in a parental control scenario. For example, a parent may provide a minor (e.g., their child) the mobile device 216a as shown in FIG. 4 so that the minor has the ability to place phone calls, check e-mail, text, listen to music, etc. It is contemplated though that the parent may wish for the child to benefit from the aspects of the present disclosure, and further to have control as to how the aspects of the present disclosure apply at or during use of the mobile device 216a, without having to worry about tampering or disabling or circumvention of the same by the minor.

Accordingly, in practice, the control selection 408 may be selected in order to gain access to a particular interface so that the ACS module 220 associated with the mobile device 216a may function according to the wishes of a particular individual (e.g., a parent). For example, the particular individual may manipulate the cursor 404 to select the control selection 408, via a "point and double-click" action using a remote control for example and, in response, the ACS module 220 of the PTR 210 may be configured to output an access interface 412 to and for presentation by the television 214c.

In one example, the access interface 412 may include a prompt "Enter Your PIN" along with a data field 414 and an enter selection 416. In this example, the particular individual may enter into the data field 414 an alphanumeric sequence or the like and then select the enter selection 416 in effort to gain access functionality associated with the configuration selection 410. Assuming that the alphanumeric sequence is authenticated by the ACS module 220 associated with the mobile device 216a following the described sequence, the configuration selection 410 may become "active" so that upon selection the configuration interface 418 may be output to and for presentation by the television 214c. In FIG. 4, the configuration selection 410 is shown as "inactive," indicated by a perimeter line that is weighted less than that of the control selection 408, or by a perimeter line that is lighter in terms of boldness than that of the control selection 408. When the configuration selection 410 becomes active the perimeter line of the same would be similar to that of the control selection 408 as shown in FIG. 4.

Again, assuming that the alphanumeric sequence is authenticated by the ACS module 220 associated with the mobile device 216a following the described sequence, the particular individual may manipulate the cursor 404 to select the configuration selection 410, via a "point and click" action, for example, and, in response, the ACS module 220 of the PTR 210 may output the configuration interface 418 to and for presentation by the television 214c. Here, it is contemplated that the particular individual may utilize the configuration interface 418 to configure the ACS module 220 associated with the mobile device 216a, as desired, to implement one or more features or aspects of the present disclosure. For example, the configuration interface 418 may include a device pair selection 420, a parameters selection 422, an actions selection 424, a distress selection 426, a train selection 428, an exceptions selection 430, an activate selection 432, and a lock selection 434. The configuration interface 418 as shown in FIG. 4 is just an example. Other examples may include more or fewer "selections" as desired, and may be implementation-specific, and further may evolve as technology evolves.

In practice, the device pair selection 420 may be selected to pair or otherwise establish a communication link or connection between the mobile device 216a and the PTR 210, such as shown in FIG. 4. In this manner, an individual may interact with the television 214c, and ultimately the PTR 210, to program or configure the mobile device 216a, as desired, to implement various features or aspects of the present disclosure. As mentioned above, this may, among other things, serve to entice new customers to subscribe to services as offered by a particular satellite television provider, as well as provide an incentive for existing customers to maintain their loyalty and/or relationship with the particular satellite television provider.

Next, but not necessarily so, the parameters selection 422 may be selected to enable and define if desired (e.g., default parameter values are contemplated) one or more contextual parameters that when met under certain circumstance may activate the mobile device 216a to generate a trigger as part of an audio attenuation process similar to that discussed above at least in connection with FIG. 1. For example, as shown in FIG. 4, a "time of day" parameter may be enabled and defined as "6-9 AM" so that when the mobile device 216a detects or senses that a time of day is between "6-9 AM," and a current magnitude of volume of the audio as output by the mobile device 216a is greater than or equal to a predetermined and user-configurable threshold value (described in further detail below), the mobile device 216a itself may, optionally, output one or more warning notifications or the like (also described in further detail below) and then attenuate the current magnitude of volume of the audio as output by the mobile device 216a to a predetermined and user-configurable value (also described in further detail below). Other examples are possible. For example, one or more different times of day may be defined, and may be defined at a specific time, and etc., such as "10 PM" and/or at any particular interval, such as "10-10:30 PM," and so on.

As another example, as shown in FIG. 4, an "ambient noise level" parameter may be enabled and defined as "90 dB" so that when the mobile device 216a detects or senses that ambient noise level is greater than or equal "90 dB," and a current magnitude of volume of the audio as output by the mobile device 216a is greater than or equal to a predetermined and user-configurable threshold value, the mobile device 216a itself may, optionally, output one or more warning notifications or the like and then attenuate the current magnitude of volume of the audio as output by the mobile device 216a to a predetermined and user-configurable value. Other examples are possible. For example, the mobile device 216a may be configured and/or arranged to detect particular "high" frequency content, such as via Fourier transform and corresponding analysis of ambient noise as acquired by the mobile device 216a, and then implement audio attenuation in accordance with the present disclosure as desired.

As another example, as shown in FIG. 4, a "movement" parameter may be enabled and defined as "10 mph" so that when the mobile device 216a detects or senses that the same is moving at a velocity (e.g., instantaneous, averaged, etc.) greater than or equal "10 mph," and a current magnitude of volume of the audio as output by the mobile device 216a is greater than or equal to a predetermined and user-configurable threshold value, the mobile device 216a itself may, optionally, output one or more warning notifications or the like and then attenuate the current magnitude of volume of the audio as output by the mobile device 216a to a predetermined and user-configurable value. Other examples are possible. For example, the mobile device 216a may be configured and/or arranged to detect altitude, such as derived from GPS (Global Positioning Satellite) data, similar to how velocity or acceleration might be derived, and then implement audio attenuation in accordance with the present disclosure as desired.

As another example, as shown in FIG. 4, a "location" parameter may be enabled and defined as "on-road" so that when the mobile device 216a detects or senses that the same is positioned or located on a motor vehicle highway or other roadway, for example, and a current magnitude of volume of the audio as output by the mobile device 216a is greater than or equal to a predetermined and user-configurable threshold value, the mobile device 216a itself may, optionally, output one or more warning notifications or the like and then attenuate the current magnitude of volume of the audio as output by the mobile device 216a to a predetermined and user-configurable value. Other examples are possible. For example, the mobile device 216a may be configured and/or arranged to determine when the same is physically "on-vehicle," motorized or not (e.g., if a user of the mobile device 216a is on a train or on a bicycle), and then implement audio attenuation in accordance with the present disclosure as desired, and etc.

Figure 5:
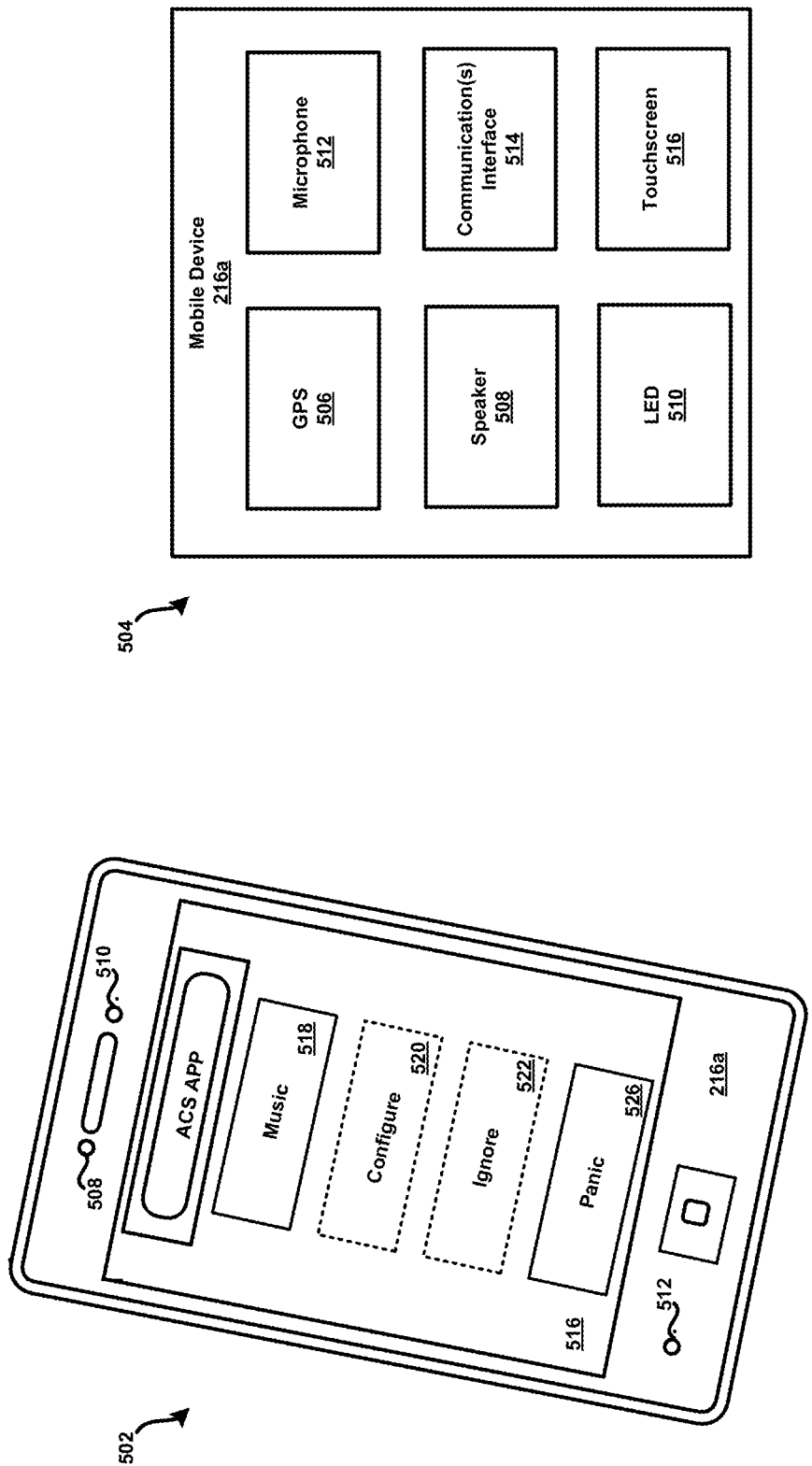
FIG. 5 shows second example aspects of the system of FIG. 2 in detail.

As mentioned throughout, the mobile device 216a may be configured and/or arranged to implement or perfect audio attenuation upon satisfaction of at least the condition that current magnitude of volume of the audio as output by the mobile device 216a is greater than or equal to a predetermined and user-configurable threshold value. It is contemplated that that threshold value may be defined via the configuration interface 418 under the parameters selection 422, such as shown in FIG. 4. As shown, an individual may set the value to be "100 dB" for example. It will be appreciated though that all values as shown in FIG. 5 are examples only, and it is contemplated that the same may defined as desired. Further, it is contemplated that all feature or aspects as discussed in the context of the present disclosure shown may be "enabled" or "disabled" as desired, shown in FIG. 4 by a "checkbox" associated with certain feature or aspects itemized within the configuration interface 418.

As mentioned above, the configuration interface 418 may further include an actions selection 424. In practice, the actions selection 424 may be selected to enable and define if desired (e.g., default values are contemplated) one or more warning notifications and also an audio attenuation factor, similar to that discussed above in connection with FIG. 1. For example, a "warnings" parameter may be enabled and defined as a "beep," so that when the mobile device 216a detects or senses that the same is positioned or located on a motor vehicle "highway" or other roadway, for example as discussed above, and a current magnitude of volume of the audio as output by the mobile device 216a is greater than or equal to a predetermined and user-configurable threshold value, the mobile device 216a itself may, optionally, output a "loud" tone or series of tones or the like, and then attenuate the current magnitude of volume of the audio as output by the mobile device 216a to a predetermined and user-configurable value. Other examples are possible. For example, the mobile device 216a may be configured and/or arranged to output a particular vibrate pattern, and/or activate an LED as a visual cue, and then implement audio attenuation in accordance with the present disclosure as desired, and etc.

Further, the actions selection 424 may be selected to enable and define if desired (e.g., default values are contemplated) an audio attenuation factor, similar to that discussed above in connection with FIG. 1. For example, a "volume level adjust" parameter may be enabled and defined as "65%" so that when the mobile device 216a detects or senses that ambient noise level is greater than or equal "90 dB," for example as discussed above, and a current magnitude of volume of the audio as output by the mobile device 216a itself is greater than or equal to a predetermined and user-configurable threshold value, the mobile device 216a may, optionally, output a "loud" tone or series of tones or the like, also as discussed above, and then attenuate the current magnitude of volume of the audio as output by the mobile device 216a to a particular value that is "65%" of a current magnitude of volume of the audio as output by the mobile device 216a. Other examples are possible. For example, the mobile device 216a may be configured and/or arranged to fully mute or disable output of audio, at least temporarily for a predetermined period of time (e.g., 5 minutes off then switch back on in response to passage of the 5 minutes), so as to minimize the possibility that a user of the mobile device 216a is too distracted to adequately respond to a potentially hazardous situation.

As mentioned above, the configuration interface 418 may further include a distress selection 426. In practice, and as discussed in further detail below in connection with FIG. 5, the ACS module 220 of the mobile device 216a, may be configured and/or arranged to enable a user of the mobile device 216a to select a "panic" button, that which when selected may instantiate one or more actions taken by the mobile device 216a to assist a user of the mobile device 216a to summon help in an emergency situation. For example, as shown in FIG. 5, a "communications" parameter may be enabled and defined as "Dial 911" so that when the mobile device 216a detects or senses that the above-mentioned panic button has been selected, the same may dial "911" for help for example. Other examples are possible. For example, the mobile device 216a may be configured and/or arranged such that a text and/or email message may be sent to a particular recipient(s) in response to selection of the panic button. Still other examples are possible. For example, the mobile device 216a may be configured and/or arranged such as to command the PTR 210 to output for display by the PTR 210, and/or one of the other computing devices 216a-b, a pop-up window with a message "Your son needs immediate assistance. Use the device location application on your mobile device to determine his approximate location and get help."

As another example, as shown in FIG. 4, a "mobile device" distress parameter may be enabled and defined as "alarm" so that when the mobile device 216a detects or senses that the above-mentioned panic button has been selected, the same may output a lou audio alarm via speaker of the mobile device 216a and/or activate an LED of the mobile device 216a to emit a "flashing" light pattern for example. Other examples are possible. For example, the mobile device 216a may be configured and/or arranged such that instead of an alarm an audio message may be output via speaker of the mobile device 216a indicating that "The Police have been notified of an emergency situation and are en route to this scene." It is contemplated that such a message may be output periodically or at least intermittently by the mobile device 216a, possibly interspersed with "threatening" sounds such as a "realistic" dog bark for example. In these and other similar examples it may be beneficial to disconnect headphones if coupled to the mobile device 216a.

As mentioned above, the configuration interface 418 may further include a train selection 428, an exceptions selection 430, an activate selection 432, and a lock selection 434. The train selection 428 and exceptions selection 430 are discussed in detail below in connection with FIGS. 5-6. With reference to the activate selection 432, it is contemplated that the same may be selected to activate or deactivate the ACS module 220 of the mobile device 216a, based on the current pairing of the mobile device 216a and the PTR 210 as shown in FIG. 4, so that the mobile device 216a may be optionally enabled to implement the various feature or aspects of the present disclosure as discussed throughout. Similarly, the lock selection 434 may be selected to activate or deactivate particular features of the ACS module 220 of the mobile device 216a so that the mobile device 216a may be enabled to implement certain, but not all, one of the various feature or aspects of the present disclosure. One example in which this may be beneficial is in a parental control scenario, and is discussed in further detail below in connection with FIG. 5.

For example, referring now to FIG. 5, second example aspects of the system 200 of FIG. 2 are shown in detail. In particular, the mobile device 216a is shown in a first view 502 and in a second view 504. For brevity, the mobile device 216a is depicted in a simplified form, and may generally include more or fewer elements or components as desired, including those configured and/or arranged for implementing various features associated with adjusting the volume of the mobile device 216a, by the mobile device 216a without direct manual user-input, based on one or more contextual parameters as discussed in the context of the present disclosure. Further, in some examples, the mobile device 216a may exhibit features consistent with that of a particular smartphone. One example of such is the iPhone® by Apple, Inc. of Cupertino. Other examples are possible.

The mobile device 216a is shown in FIG. 5 to exhibit a GPS module 506, at least one speaker 508, at least one LED 510, at least one microphone 512, at least one communication interface 514, and a touchscreen 516. Other examples are possible. For example, while a number of components of the mobile device 216a is or are shown incorporated to or within the same on a "front" side as per the first view 502, it is contemplated that one or more of the same may be incorporated to or within the mobile device 216a at different locations, such as a "back" side or a "bottom end" for example, and such an arrangement may implementation-specific.

Referring now specifically to the first view 502 of FIG. 5, a number of selectable "software" buttons are shown as displayed by the touchscreen 516, including a music button 518, a configure button 520, an ignore button 522, and a panic button 524. In practice, it is contemplated that the music button 518 may be selected, e.g., via "tap," by a user of the mobile device 216a to allow the user to access a particular digital music media player, select a particular instance of digital music, and also adjust volume level of the digital music as output by the mobile device 216a. Further, it is contemplated that the configure button 520 may be selected by the user of the mobile device 216a to allow the user to access the configuration interface 418, as shown and described above in connection with FIG. 4, to configure the ACS module 220 associated with the mobile device 216a, as desired, to implement one or more features or aspects of the present disclosure. However, in some examples, the configure button 520 may only be accessible (the configure button 520 is indicated as inaccessible in FIG. 4 by intermittent line) when at a prior point in time the lock selection 434 of the configuration interface 418 is selected to activate or enable the configure button 520. Such an implementation may be beneficial in a parental control scenario where a parent may wish for a child to benefit from the aspects of the present disclosure, and further to have control as to how the aspects of the present disclosure apply at or during use of the mobile device 216a, without having to worry about tampering or disabling or circumvention of the same by the minor.

Similarly, the ignore button 522 may only be accessible when at a prior point in time the train selection 428 of the configuration interface 418 is selected to activate or enable the ignore button 522. It is contemplated that the ignore button 522 may be selected by the user of the mobile device 216a to allow the user to "train" the ACS module 220 of the mobile device 126a to respond to certain situations or scenarios in a particular way. More specifically, the user of the mobile device 216a may via the ignore button 522 train or condition the ACS module 220 to not attenuate the current magnitude of volume of the audio as output by the mobile device 216a in a particular situation. An example of such may be when the "time of day" parameter of the configuration interface 418 is enabled and defined as "6-9 AM," but the intention of the user of the mobile device 216a is to have that particular rule apply only on a weekday, i.e., Monday-Friday, and not a weekend day, as discussed in further detail below in connection with FIG. 6.

Still referring specifically to the first view 502, the panic button 524 may be selected by the user of the mobile device 216a to enable the user the mobile device 216a to summon help in an emergency situation. For example, while walking on a train platform late at night the user of the mobile device 216a may feel threatened by an individual perceived to be following the user of the mobile device 216a. Here, it is contemplated that the panic button 524 may be selected (e.g., via "double-tap") and based upon configuration of the ACS module 220 of the mobile device 126a, such as discussed above on connection with the distress selection 426 of the configuration interface 418, the mobile device 126a may respond "dial 911" for example, send a text and/or email message to a particular recipient(s), send a command the PTR 210 to output for display by the PTR 210, and/or one of the other computing devices 216a-b, a pop-up window with a message "Immediate assistance requested." It is further contemplated that at least an approximate position of the mobile device 126a may further be communicated to one or more particular parties based on data as derived from or by the GPS module 506 of the mobile device 126a. Such data as acquired and/or derived by the GPS module 506 may be utilized in a number of different ways so as to enable various features or aspects of the present disclosure, discussed in detail below in connection with second view 504 of the mobile device 126a of FIG. 5.

In some examples the panic button 524 may be "larger" than one or more of the controls 518, 520, 522, so as to more fully distinguish the panic button 524 and make the same easier to access or use. For instance, in some examples, the panic button 524 may be defined so as to occupy about 50% of the space on the touchscreen 516, where the other controls 518, 520, 522 would then occupy the remaining space on the touchscreen 516. Still other examples are possible. For instance, in some examples functionality offered by or associated with the panic button 524 may be wholly or at least partially implemented in an alternate way(s) or manner(s). For instance, it is contemplated that the mobile device 216a may be configured and/or arranged to implement one or more actions, that might normally be associated with a physical "press" of the panic button 524, upon detection by the mobile device 216a of an intentional "shake," such as when the mobile device 216a is held in-hand and then "shook" back and forth, or left or right, etc., and/or upon detection by the mobile device 216a of an unintentional "shake," such as due to the trembling or fear of an individual that has the mobile device 216a on their person. Here, it is contemplated that a gyroscope incorporated within or in the mobile device 216a may serve as a detector of the intentional or unintentional "shake." Still many other examples are possible. For example, it is contemplated that the mobile device 216a may be configured and/or arranged to implement one or more actions, that might normally be associated with a physical "press" of the panic button 524, upon detection or capture by a camera of the mobile device 216a of a particular danger or dangerous situation (e.g., approaching "hooded" human figure). In this manner, it is contemplated that of a number of different resources may work in concert or separately to implement functionality offered by or associated with the panic button 524.

For example, referring now specifically to the second view 504 of FIG. 5, it is contemplated that, in addition to enabling the above-mentioned functionality associated with the panic button 524, data as acquired and/or derived by the GPS module 506 of the mobile device 126a may be utilized by the mobile device 126a to enable the same to implement various features other associated with adjusting the volume of a particular computing device, by the computing device without direct manual user-input, based on one or more contextual parameters in accordance with the principles of the present disclosure. For example, such data may enable to the mobile device 216a to determine physical movement or displacement of the mobile device 216a, absolute location or position of the mobile device 216a, and etc. Accordingly, the GPS module 506 of the mobile device 126a may permit the same to leverage the above-described "movement" parameter and also "location" parameter so that the mobile device 216a may, optionally, output one or more warning notifications or the like and then attenuate the current magnitude of volume of the audio as output by the mobile device 216a to a predetermined and user-configurable value.

In a similar way, the speaker 508, LED 510, microphone 512, communication interface 514, and touchscreen 516 of the mobile device 216a may permit the same to enable a user of the mobile device 216a, in manners described in detail above with respect to functionality that may be understood to be associated with each of those respective elements, from being too distracted by audio currently being output by the mobile device 216a, by automatically adjusting the volume of mobile device 216a when one or more contextual criterion are determined to be met by the mobile device 216a itself. Still many other examples are contemplated.

Figure 6:
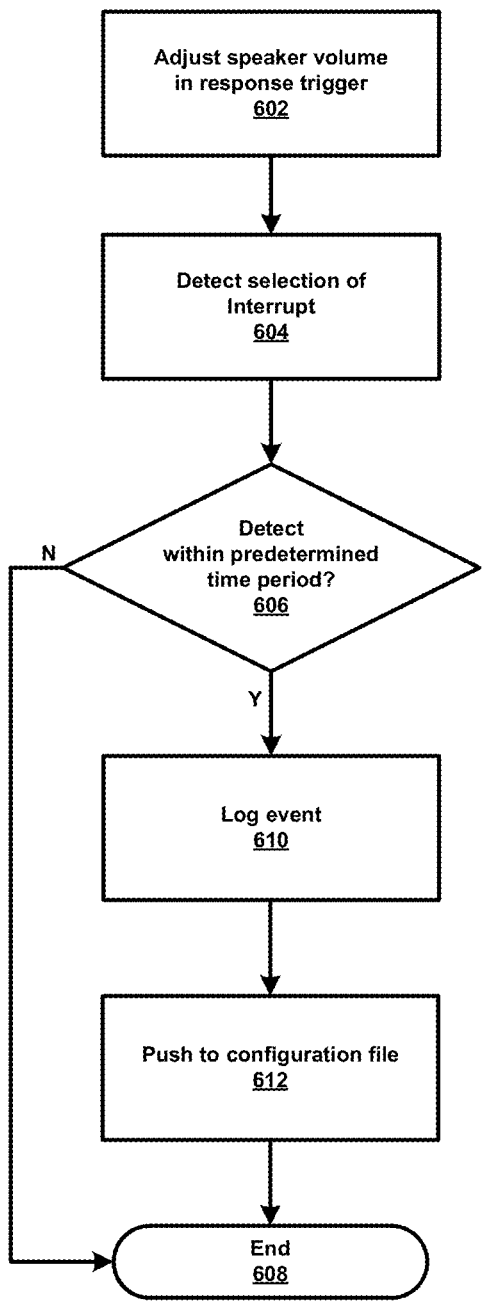
FIG. 6 shows a second example method according to the disclosure.

Referring now to FIG. 6, a second example method 600 is shown in accordance with the present disclosure. In particular, the method 600 may illustrate an algorithm to enable a user of the mobile device 216a to "train" the ACS module 220 of the mobile device 216a to respond to certain situations or scenarios in a particular way. For example, at step 602, the mobile device 216a itself may attenuate the current magnitude of volume of the audio as output by the mobile device 216a, to a predetermined and user-configurable value, in a manner similar to that described above in connection with at least FIG. 1. Next, at step 604, the mobile device 216a may detect selection of the ignore button 522, that element discussed above in connection with at least FIG. 5.

Next, at step 606, a determination may be made by the mobile device 216a as to whether a particular predetermined and user-configurable time period has elapsed between attenuation of the current magnitude of volume of the audio as output by the mobile device 216a (step 602) and detection of selection of the ignore button 522 (step 604). An example of such a time period may include sixty (60) seconds; however, other examples are possible. When, for example, the particular predetermined and user-configurable time period has in fact elapsed between attenuation of the current magnitude of volume of the audio as output by the mobile device 216a and detection of selection of the ignore button 522, process flow within the example method 600 may branch to termination step 608.

When, however, the particular predetermined and user-configurable time period has in fact not elapsed between attenuation of the current magnitude of volume of the audio as output by the mobile device 216a and detection of selection of the ignore button 522, process flow within the example method 600 may branch to step 610. At step 610, the mobile device 216a itself may log or "push" to persistent storage, in a table, database, etc., the event or sequence of events that led to the attenuation of the current magnitude of volume of the audio as output by the mobile device 216a.

For instance, and continuing with the example mentioned above in connection with FIG. 5, the mobile device 216a may determine that attenuation of the current magnitude of volume of the audio as output by the mobile device 216a (step 602) was perfected because the "time of day" parameter was enabled and defined as "6-9 AM," and that the mobile device 216a had detected or sensed that a time of day was in fact "8:30 AM," and at the same time the current magnitude of volume of the audio as output by the mobile device 216a was greater than or equal to the predetermined and user-configurable threshold value. In this example, however, the actual day itself may have been (or is) a particular weekend day, i.e., Saturday, and it might be that the user of the mobile device 216a would rather the weekend be an exception to the "time of day" rule. It will be appreciated that this is only an example, and that many other examples of "exceptions" are possible.

Next, at step 610, the mobile device 216a may push the log file to the ACS module 220 of the PTR 210 via any particular communication connection. Here, it is contemplated that the user of the mobile device 216a may at some point access the configuration interface 418 as shown and described above in connection with FIG. 4 and then, in turn, select the exceptions selection 430 to either "accept" the exception that the user of the mobile device 216a would rather the weekend (or just Saturday) be an exception to the "time of day" rule, or "decline" the exception that the user of the mobile device 216a would rather the weekend (or just Saturday) be an exception to the "time of day" rule. It is further contemplated that the ACS module 220 of the PTR 210 may then at some point push the exception, if in fact accepted, to the ACS module 220 of the mobile device 126a so that the same may respond in a manner as desired by the user of the mobile device 126a. In this manner, the user of the mobile device 216a may "train" the corresponding ACS module 220 to respond to certain situations scenarios in a particular way.

As mentioned above, the various features or aspects of the present disclosure address various issues associated with the potential of being too distracted by audio currently being output by a particular computing device, such as a smartphone for example, by automatically adjusting the volume of that computing device when one or more contextual criterion are determined to be met by the computing device itself. In addition, and as discussed throughout, it is contemplated that various features or aspects of the present disclosure may be incorporated into or within a television receiver as part of a satellite television implementation. Other advantages or benefits may include enhancing end-user safety and, when the end-user is a child, peace of mind for the parent(s) of that child in that the parent and/or child would be promptly made aware if there was an issue. Still other advantages or benefits may be scenario-specific. For example, if the end-user has their headphones on in a building and loud noise such as a fire alarm or a door bell activates, the output sound level could be reduced to a level so that the first alarm or door may be heard, or, if being used in a vehicle car then noise such as police sirens or ambulances could be detected to alert the end-user.

In one example implementation, a method may include or comprise detecting, by a mobile device, ambient noise level at time of output of audio by the mobile device at a particular volume level. Here, the mobile device may thus be configured and/or arranged to detect noise level of immediate surrounding at the same time that the mobile device outputs audio content, such as music for example. The method may further include or comprise comparing, by the mobile device, the ambient noise level to a threshold value. Here, the mobile device may thus be configured and/or arranged to quantify ambient noise level and then compare the same to a threshold value. It is contemplated that the threshold value is a user-configurable parameter. The method may further include or comprise decreasing, by the mobile device, the particular volume level by a predetermined factor when the ambient noise level is greater than or equal to the threshold value. Here, the mobile device may thus be configured and/or arranged to quantify output volume level, and then attenuate the same to exhibit a different, less loud, volume level in accordance with the principles of the present disclosure. It is contemplated that the predetermined factor, e.g., 75% of maximum volume level, is a user-configurable parameter.

In another example implementation, a method may include or comprise outputting, by a mobile device, audio at a particular volume level, monitoring, by the mobile device level at time of outputting the audio, for occurrence of a particular state or parameter detectable by the mobile device, and decreasing, by the mobile device, the particular volume level in response to detecting occurrence of the particular state or parameter by the mobile device so that output volume level of the mobile device is less than the particular volume level. Here, it is contemplated that the particular state or parameter could correspondingly to any particular factor measurable or otherwise discernible by the mobile device. Some examples of such include time of day, movement and/or positioning of the mobile device itself, ambient noise level, noise level of audio currently or instantly being output by the mobile device. Additionally, in some examples an alert may be output by the mobile device so that an end-user is "made aware" or forced to focus on their surrounding. In general, the alert may include or comprise one or more of an audio alert, a visual alert, a tactile alert, and/or any combination thereof.

In another example implementation a television receiver may include or comprise at least one processor, at least one communications interface communicatively coupled with the at least one processor, and at least one memory element communicatively coupled with and readable by at least one processor and having stored therein processor-readable instructions. The processor-readable instructions when executed by the at least one processor may cause the at least one processor to send to a mobile device via the at least one communications interface data that corresponds to a definition of a threshold value used by the mobile device to compare with ambient noise level detected by the mobile device and to enable the mobile device to decrease output volume level of the mobile device when ambient noise level detected by the mobile device is greater than or equal to the threshold value. Such an implementation may, among other things, serve to entice new customers to subscribe to services as offered by a particular satellite television provider, as well as provide an incentive for existing customers to maintain their loyalty and/or relationship with the particular satellite television provider.

Figure 7:
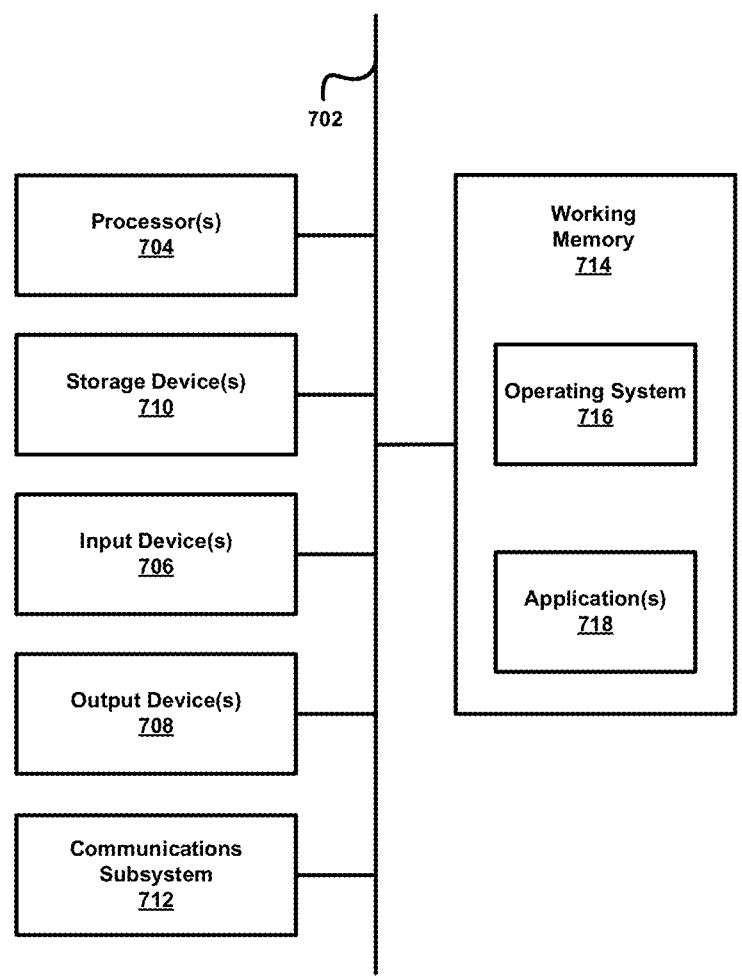
FIG. 7 shows an example computing system or device.

FIG. 7 shows an example computer system or device 700 in accordance with the disclosure. An example of a computer system or device includes an enterprise server, blade server, desktop computer, laptop computer, tablet computer, personal data assistant, smartphone, gaming console, STB, television receiver, and/or any other type of machine configured for performing calculations. Any particular one of the previously-described computing devices may be wholly or at least partially configured to exhibit features similar to the computer system 700, such as any of the respective elements of at least FIG. 2. In this manner, any of one or more of the respective elements of at least FIG. 2 may be configured to perform and/or include instructions that, when executed, perform the method of FIG. 1 and/or the method of FIG. 6. Still further, any of one or more of the respective elements of at least FIG. 1 may be configured to perform and/or include instructions that, when executed, instantiate and implement functionality of the PTR 210 and/or the computing devices 216a-c.

The computer device 700 is shown comprising hardware elements that may be electrically coupled via a bus 702 (or may otherwise be in communication, as appropriate). The hardware elements may include a processing unit with one or more processors 704, including without limitation one or more general-purpose processors and/or one or more special-purpose processors (such as digital signal processing chips, graphics acceleration processors, and/or the like); one or more input devices 706, which may include without limitation a remote control, a mouse, a keyboard, and/or the like; and one or more output devices 708, which may include without limitation a presentation device (e.g., television), a printer, and/or the like.

The computer system 700 may further include (and/or be in communication with) one or more non-transitory storage devices 710, which may comprise, without limitation, local and/or network accessible storage, and/or may include, without limitation, a disk drive, a drive array, an optical storage device, a solid-state storage device, such as a random access memory, and/or a read-only memory, which may be programmable, flash-updateable, and/or the like. Such storage devices may be configured to implement any appropriate data stores, including without limitation, various file systems, database structures, and/or the like.

The computer device 700 might also include a communications subsystem 712, which may include without limitation a modem, a network card (wireless and/or wired), an infrared communication device, a wireless communication device and/or a chipset such as a Bluetooth™ device, 702.11 device, WiFi device, WiMax device, cellular communication facilities such as GSM (Global System for Mobile Communications), W-CDMA (Wideband Code Division Multiple Access), LTE (Long Term Evolution), etc., and/or the like. The communications subsystem 712 may permit data to be exchanged with a network (such as the network described below, to name one example), other computer systems, and/or any other devices described herein. In many examples, the computer system 700 will further comprise a working memory 714, which may include a random access memory and/or a read-only memory device, as described above.

The computer device 700 also may comprise software elements, shown as being currently located within the working memory 714, including an operating system 716, device drivers, executable libraries, and/or other code, such as one or more application programs 718, which may comprise computer programs provided by various examples, and/or may be designed to implement methods, and/or configure systems, provided by other examples, as described herein. By way of example, one or more procedures described with respect to the method(s) discussed above, and/or system components might be implemented as code and/or instructions executable by a computer (and/or a processor within a computer); in an aspect, then, such code and/or instructions may be used to configure and/or adapt a general purpose computer (or other device) to perform one or more operations in accordance with the described methods.

A set of these instructions and/or code might be stored on a non-transitory computer-readable storage medium, such as the storage device(s) 710 described above. In some cases, the storage medium might be incorporated within a computer system, such as computer system 700. In other examples, the storage medium might be separate from a computer system (e.g., a removable medium, such as flash memory), and/or provided in an installation package, such that the storage medium may be used to program, configure, and/or adapt a general purpose computer with the instructions/code stored thereon. These instructions might take the form of executable code, which is executable by the computer device 700 and/or might take the form of source and/or installable code, which, upon compilation and/or installation on the computer system 700 (e.g., using any of a variety of generally available compilers, installation programs, compression/decompression utilities, etc.), then takes the form of executable code.

It will be apparent that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

As mentioned above, in one aspect, some examples may employ a computer system (such as the computer device 700) to perform methods in accordance with various examples of the disclosure. According to a set of examples, some or all of the procedures of such methods are performed by the computer system 700 in response to processor 704 executing one or more sequences of one or more instructions (which might be incorporated into the operating system 716 and/or other code, such as an application program 718) contained in the working memory 714. Such instructions may be read into the working memory 714 from another computer-readable medium, such as one or more of the storage device(s) 710. Merely by way of example, execution of the sequences of instructions contained in the working memory 714 may cause the processor(s) 704 to perform one or more procedures of the methods described herein.

The terms "machine-readable medium" and "computer-readable medium," as used herein, may refer to any non-transitory medium that participates in providing data that causes a machine to operate in a specific fashion. In an embodiment implemented using the computer device 700, various computer-readable media might be involved in providing instructions/code to processor(s) 704 for execution and/or might be used to store and/or carry such instructions/code. In many implementations, a computer-readable medium is a physical and/or tangible storage medium. Such a medium may take the form of a non-volatile media or volatile media. Non-volatile media may include, for example, optical and/or magnetic disks, such as the storage device(s) 710. Volatile media may include, without limitation, dynamic memory, such as the working memory 714.

Example forms of physical and/or tangible computer-readable media may include a floppy disk, a flexible disk, hard disk, magnetic tape, or any other magnetic medium, a compact disc, any other optical medium, ROM (Read Only Memory), RAM (Random Access Memory), and etc., any other memory chip or cartridge, or any other medium from which a computer may read instructions and/or code. Various forms of computer-readable media may be involved in carrying one or more sequences of one or more instructions to the processor(s) 704 for execution. By way of example, the instructions may initially be carried on a magnetic disk and/or optical disc of a remote computer. A remote computer might load the instructions into its dynamic memory and send the instructions as signals over a transmission medium to be received and/or executed by the computer system 700.

The communications subsystem 712 (and/or components thereof) generally will receive signals, and the bus 702 then might carry the signals (and/or the data, instructions, etc. carried by the signals) to the working memory 714, from which the processor(s) 704 retrieves and executes the instructions. The instructions received by the working memory 714 may optionally be stored on a non-transitory storage device 710 either before or after execution by the processor(s) 704.

It should further be understood that the components of computer device 700 can be distributed across a network. For example, some processing may be performed in one location using a first processor while other processing may be performed by another processor remote from the first processor. Other components of computer system 700 may be similarly distributed. As such, computer device 700 may be interpreted as a distributed computing system that performs processing in multiple locations. In some instances, computer system 700 may be interpreted as a single computing device, such as a distinct laptop, desktop computer, or the like, depending on the context.

The methods, systems, and devices discussed above are examples. Various configurations may omit, substitute, or add various method steps or procedures, or system components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those of skill with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations may be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Furthermore, the example examples described herein may be implemented as logical operations in a computing device in a networked computing system environment. The logical operations may be implemented as: (i) a sequence of computer implemented instructions, steps, or program modules running on a computing device; and (ii) interconnected logic or hardware modules running within a computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
   establishing, by a mobile device, a telecommunications link between the mobile device and a television receiver;
   receiving, by the mobile device and from the television receiver via the telecommunications link, a threshold value, wherein the threshold value corresponds to a noise level threshold;
   storing, by the mobile device, the threshold value to a local persistent storage device;
   receiving, by the mobile device and from the television receiver via the telecommunications link, a time of day parameter, wherein the time of day parameter identifies times for which audio attenuation by the mobile device is to be active;
   storing, by the mobile device time of day parameter to the local persistent storage device;
   receiving, by the mobile device and from the television receiver via the telecommunications link, an audio output threshold level;
   storing, by the mobile device, the audio output threshold level to the local persistent storage device;
   receiving, by the mobile device and from the television receiver via the telecommunications link, an audio attenuation factor;
   storing, by the mobile device, the audio attenuation factor to the local persistent storage device;
   outputting, by the mobile device, audio at a particular volume level;
   comparing, by the mobile device, a current time to the time of day parameter;
   determining, by the mobile device, that the current time falls within the time of day parameter;
   comparing, by the mobile device; the particular volume level to the audio output threshold level;
   determining, by the mobile device, that the particular volume level is greater than or equal to the audio output threshold level;
   attenuating, by the mobile device, the particular volume level using the audio attenuation factor
   activating, by the mobile device, a microphone of the mobile device to detect ambient noise;
   detecting, by the mobile device, an ambient noise level of the ambient noise while outputting audio;
   comparing, by the mobile device, the ambient noise level to the threshold value;
   determining, by the mobile device, that the ambient noise level is greater than or equal to the threshold value; and
   decreasing, by the mobile device, the particular volume level by a predetermined factor.

2. The method of claim 1, further comprising:
   receiving, by the mobile device and from the television receiver via the telecommunications link, a location parameter;
   storing, by the mobile device, the location parameter to the local persistent storage device;
   receiving, by the mobile device and from the television receiver via the telecommunications link, an audio output threshold level;
   storing, by the mobile device, the audio output threshold level to the local persistent storage device;
   receiving, by the mobile device and from the television receiver via the telecommunications link, an audio attenuation factor;
   storing, by the mobile device, the audio attenuation factor to the local persistent storage device;
   determining, by the mobile device, a current location of the mobile device;
   comparing, by the mobile device, the current location to the location parameter;
   determining, by the mobile device, that the current location falls within the location parameter;
   comparing, by the mobile device; the particular volume level to the audio output threshold level;
   determining, by the mobile device, that the particular volume level is greater than or equal to the audio output threshold level; and
   attenuating, by the mobile device, the particular volume level using the audio attenuation factor.

3. The method of claim 1, further comprising:
   receiving, by the mobile device and from the television receiver via the telecommunications link, a movement parameter;
   storing, by the mobile device, the movement parameter to the local persistent storage device;
   receiving, by the mobile device and from the television receiver via the telecommunications link, an audio output threshold level;
   storing, by the mobile device, the audio output threshold level to the local persistent storage device;
   receiving, by the mobile device and from the television receiver via the telecommunications link, an audio attenuation factor;
   storing, by the mobile device, the audio attenuation factor to the local persistent storage device;
   determining, by the mobile device, a velocity of the mobile device;
   comparing, by the mobile device, the velocity to the movement parameter;
   determining, by the mobile device, that the velocity is greater than or equal to the movement parameter;
   comparing, by the mobile device; the particular volume level to the audio output threshold level;
   determining, by the mobile device, that the particular volume level is greater than or equal to the audio output threshold level; and
   attenuating, by the mobile device, the particular volume level using the audio attenuation factor.

4. The method of claim 1, further comprising:
   outputting by a speaker of the mobile device an audible warning signal when the ambient noise level is greater than or equal to the threshold value.

5. The method of claim 1, further comprising:
   outputting by a vibratory mechanism of the mobile device a tactile warning signal when the ambient noise level is greater than or equal to the threshold value.

6. The method of claim 1, further comprising:
   outputting by a display screen of the mobile device a visual warning when the ambient noise level is greater than or equal to the threshold value.

7. The method of claim 1, further comprising:
   outputting by a light source of the mobile device a visual warning signal when the ambient noise level is greater than or equal to the threshold value.

8. The method of claim 1, further comprising:
   generating, by the mobile device, a command to instantiate a communication for transmission by the mobile device selected from a phone call, a text message, and an electronic mail to summon assistance in a perceived emergency situation.

9. The method of claim 1, further comprising:
detecting, by the mobile device, the ambient noise level to be greater than or equal to the threshold value;
decreasing, by the mobile device in response to the detecting, the particular volume level by the predetermined factor so that output volume level of the mobile device is less than the particular volume level; and
increasing, by the mobile device in response to an override command received by the mobile device within a particular time period of the decreasing, output volume level of the mobile device to be greater than or equal to the particular volume level.

10. A method, comprising:
establishing, by a mobile device, a telecommunications link between the mobile device and a television receiver;
receiving, by the mobile device and from the television receiver via the telecommunications link, an attenuation factor;
storing, by the mobile device, the attenuation factor to a local persistent storage device;
receiving, by the mobile device and from the television receiver via the telecommunications link, data corresponding to a definition of a particular state or parameter to be monitored by the mobile device;
storing, by the mobile device, the data corresponding to the definition of the particular state or parameter to the local persistent storage device;
outputting, by a mobile device, audio at a particular volume level;
receiving, by the mobile device and from the television receiver via the telecommunications link, a time of day parameter, wherein the time of day parameter identifies times for which audio attenuation by the mobile device is to be active;
storing, by the mobile device, the time of day parameter to the local persistent storage device;
receiving, by the mobile device and from the television receiver via the telecommunications link, an audio output threshold level;
storing, by the mobile device, the audio output threshold level to the local persistent storage device;
receiving, by the mobile device and from the television receiver via the telecommunications link, an audio attenuation factor;
storing, by the mobile device, the audio attenuation factor to the local persistent storage device;
comparing, by the mobile device, a current time to the time of day parameter;
detecting, by the mobile device, that the current time falls within the time of day parameter;
comparing, by the mobile device; the particular volume level to the audio output threshold level;
determining, by the mobile device, that the particular volume level is greater than or equal to the audio output threshold level;
decreasing by the mobile device the particular volume level using the audio attenuation factor
monitoring, by the mobile device while outputting the audio, for occurrence of the particular state or parameter;
detecting occurrence of the particular state or parameter; and decreasing, by the mobile device, the particular volume level using the attenuation factor.

11. The method of claim 10, further comprising:
receiving, by the mobile device and from the television receiver via the telecommunications link, a movement parameter;
storing, by the mobile device, the movement parameter to the local persistent storage device;
receiving, by the mobile device and from the television receiver via the telecommunications link, an audio output threshold level;
storing, by the mobile device, the audio output threshold level to the local persistent storage device;
receiving, by the mobile device and from the television receiver via the telecommunications link, an audio attenuation factor;
storing, by the mobile device, the audio attenuation factor to the local persistent storage device;
determining, by the mobile device, a velocity of the mobile device;
comparing, by the mobile device, the velocity to the movement parameter;
determining, by the mobile device, that the velocity is greater than or equal to the movement parameter;
comparing, by the mobile device; the particular volume level to the audio output threshold level;
determining, by the mobile device, that the particular volume level is greater than or equal to the audio output threshold level; and
attenuating, by the mobile device, the particular volume level using the audio attenuation factor.

12. The method of claim 10, further comprising:
receiving, by the mobile device and from the television receiver via the telecommunications link, a location parameter;
storing, by the mobile device, the location parameter to the local persistent storage device;
receiving, by the mobile device and from the television receiver via the telecommunications link, an audio output threshold level;
storing, by the mobile device, the audio output threshold level to the local persistent storage device;
receiving, by the mobile device and from the television receiver via the telecommunications link, an audio attenuation factor;
storing, by the mobile device, the audio attenuation factor to the local persistent storage device;
determining, by the mobile device, a current location of the mobile device;
comparing, by the mobile device, the current location to the location parameter;
determining, by the mobile device, that the current location falls within the location parameter;
comparing, by the mobile device; the particular volume level to the audio output threshold level;
determining, by the mobile device, that the particular volume level is greater than or equal to the audio output threshold level; and
attenuating, by the mobile device, the particular volume level using the audio attenuation factor.

13. The method of claim 10, further comprising:
receiving, by the mobile device and from the television receiver via the telecommunications link, a threshold value, wherein the threshold value corresponds to a noise level threshold;
storing, by the mobile device, the threshold value to a local persistent storage device;

activating, by the mobile device, a microphone of the mobile device to detect ambient noise;

detecting, by the mobile device, an ambient noise level of the ambient noise while outputting audio;

comparing, by the mobile device, the ambient noise level to the threshold value;

determining, by the mobile device, that the ambient noise level is greater than or equal to the threshold value; and decreasing, by the mobile device, the particular volume level using the attenuation factor.

14. The method of claim 10, further comprising:

receiving, by the mobile device and from the television receiver via the telecommunications link, an audio output threshold level;

storing, by the mobile device, the audio output threshold level to the local persistent storage device;

comparing, by the mobile device; the particular volume level to the audio output threshold level;

determining, by the mobile device, that the particular volume level is greater than or equal to the audio output threshold level; and decreasing, by the mobile device, the particular volume level using the attenuation factor.

15. The method of claim 10, further comprising:

outputting by the mobile device at least one of an audio, tactile, and video alert in response to detecting occurrence of the particular state or parameter by the mobile device.

16. The method of claim 10, further comprising:

detecting, by the mobile device, completion of occurrence of the particular state or parameter; and increasing, by the mobile device, the particular volume level using the attenuation factor.

17. The method of claim 10, further comprising:

receiving, by the mobile device and from the television receiver via the telecommunications link, data that corresponds to a definition of the particular state or parameter to be monitored by the mobile device; and storing, by the mobile device to a local persistent storage device, the data that corresponds to the definition of the particular state or parameter to be monitored by the mobile device.

18. A television receiver, comprising:

at least one processor;

at least one communications interface communicatively coupled with the at least one processor; and at least one memory element communicatively coupled with and readable by at least one processor and having stored therein processor-readable instructions that, when executed by the at least one processor, cause the at least one processor to perform operations including:

receiving input corresponding to determination of a threshold value, wherein the threshold value corresponds to a noise level threshold for comparison by the mobile device with an ambient noise level;

receiving input corresponding to determination of an attenuation factor, wherein the attenuation factor corresponds to an amount by which an audio output level of the mobile device is to be attenuated when the ambient noise level detected by the mobile device is greater than or equal to the threshold value;

receiving input corresponding to determination of a time of day parameter, wherein the time of day parameter identifies times for which audio attenuation by the mobile device is to be active;

establishing a telecommunications link between the television receiver and the mobile device;

sending, to the mobile device via the telecommunications link, the threshold value;

sending, to the mobile device via the telecommunications link, the attenuation factor; and sending, to the mobile device via the telecommunications link, the time of day parameter.

* * * * *